United States Patent
Jeon et al.

(10) Patent No.: US 8,569,947 B2
(45) Date of Patent: Oct. 29, 2013

(54) ORGANIC LIGHT EMITTING DIODE DISPLAY FOR REDUCING REFLECTION OF EXTERNAL LIGHT

(75) Inventors: Hee-Chul Jeon, Yongin (KR); Noh-Min Kwak, Yongin (KR); Eun-Ah Kim, Yongin (KR); Soon-Ryong Park, Yongin (KR); Joo-Hwa Lee, Yongin (KR); Woo-Suk Jung, Yongin (KR); Chul-Woo Jeong, Yongin (KR); Hee-Seong Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 594 days.

(21) Appl. No.: 12/725,306

(22) Filed: Mar. 16, 2010

(65) Prior Publication Data
US 2010/0238096 A1 Sep. 23, 2010

(30) Foreign Application Priority Data
Mar. 19, 2009 (KR) .................. 10-2009-0023646

(51) Int. Cl.
*H01J 1/62* (2006.01)
*H01L 27/28* (2006.01)
*H05B 33/00* (2006.01)

(52) U.S. Cl.
USPC ........... 313/504; 313/500; 313/503; 313/505; 428/690

(58) Field of Classification Search
USPC .................................. 313/504–506
See application file for complete search history.

(56) References Cited

U.S. PATENT DOCUMENTS

| 6,366,025 | B1 * | 4/2002 | Yamada .................. 315/169.3 |
| 6,940,222 | B2 * | 9/2005 | Sakurai .................... 313/500 |
| 7,443,093 | B2 | 10/2008 | Jianpu et al. |
| 7,492,337 | B2 * | 2/2009 | Fukase ...................... 345/76 |

(Continued)

FOREIGN PATENT DOCUMENTS

| CN | 1491069 A | 4/2004 |
| EP | 1 032 045 A2 | 8/2000 |

(Continued)

OTHER PUBLICATIONS

European Search Report dated Jul. 15, 2010, for corresponding European Patent application 10156910.1.

*Primary Examiner* — Sikha Roy
(74) *Attorney, Agent, or Firm* — Christie, Parker & Hale, LLP

(57) ABSTRACT

An organic light emitting diode display includes a pixel having a plurality of sub-pixels. Each of the plurality of sub-pixels includes a first sub-pixel having a first anode and a first organic emission layer, a second sub-pixel having a second anode and a second organic emission layer, and a third sub-pixel having a third anode and a third organic emission layer. The first, second, and third anodes satisfy the following condition:

$$W1 + W2 < 2W3 < \frac{2}{3}P$$

where W1, W2, and W3 respectively denote the width of the first anode, the width of the second anode, and the width of the third anode measured along a direction traversing the first sub-pixel, the second sub-pixel, and the third sub-pixel and where P denotes a width of the pixel measure along the direction traversing the first sub-pixel, the second sub-pixel, and the third sub-pixel.

15 Claims, 6 Drawing Sheets

(56) References Cited

U.S. PATENT DOCUMENTS

| | | | |
|---|---|---|---|
| 8,093,808 B2 * | 1/2012 | Koshihara | 313/506 |
| 8,130,177 B2 * | 3/2012 | Nakatani et al. | 345/76 |
| 2003/0218419 A1 * | 11/2003 | Bae | 313/504 |
| 2004/0051448 A1 * | 3/2004 | Matsumoto | 313/506 |
| 2005/0218792 A1 | 10/2005 | Jianpu et al. | |
| 2006/0022587 A1 | 2/2006 | Jeong et al. | |
| 2008/0299496 A1 | 12/2008 | Hirakata et al. | |

FOREIGN PATENT DOCUMENTS

| | | |
|---|---|---|
| EP | 1 381 095 A2 | 1/2004 |
| JP | 2001-290441 | 10/2001 |
| JP | 2002-208485 | 7/2002 |
| JP | 2003-076301 | 3/2003 |
| JP | 2003-168561 | 6/2003 |
| JP | 2004-335467 | 11/2004 |
| JP | 2005-222915 | 8/2005 |
| JP | 2005-322633 | 11/2005 |
| JP | 2006-019233 | 1/2006 |
| JP | 2006-286600 | 10/2006 |
| JP | 2006-313350 | 11/2006 |
| JP | 2007-042443 | 2/2007 |
| JP | 2007-095609 | 4/2007 |
| JP | 2008-299352 | 12/2008 |
| KR | 1020040024484 A | 3/2004 |
| KR | 10-2005-0048348 A | 5/2005 |

* cited by examiner

US 8,569,947 B2

ORGANIC LIGHT EMITTING DIODE DISPLAY FOR REDUCING REFLECTION OF EXTERNAL LIGHT

CROSS-REFERENCE TO RELATED APPLICATION

This application claims priority to and the benefit of Korean Patent Application No. 10-2009-0023646, filed in the Korean Intellectual Property Office, on Mar. 19, 2009, the entire content of which is incorporated herein by reference.

BACKGROUND OF THE INVENTION (a) Field of the Invention

The following description relates to an organic light emitting diode (OLED) display.

(b) Description of the Related Art

Display quality of an OLED display is greatly influenced by external light. That is, when external light is transmitted into the OLED display that includes an OLED and a thin film transistor, reflection of the external light occurs in layers that form the OLED and the thin film transistor. For example, a metal layer used as an electrode of the OLED has high light reflectivity so that most of the external light can be reflected. The reflected external light is mixed with light emitted from an organic emission layer so that display visibility of the OLED display is deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

An aspect of an embodiment of the present invention is directed toward an organic light emitting diode (OLED) display capable of reducing or minimizing reflection of external light to improve display visibility of the OLED display.

An OLED display according to an exemplary embodiment of the present invention includes a pixel having a plurality of sub-pixels. Each of the plurality of sub-pixels includes a first sub-pixel having a first anode and a first organic emission layer, a second sub-pixel having a second anode and a second organic emission layer, and a third sub-pixel having a third anode and a third organic emission layer. The first, second, and third anodes satisfy the following condition:

$$W1 + W2 < 2W3 < \frac{2}{3}P$$

where W1, W2, and W3 respectively denote a width of the first anode, a width of the second anode, and a width of the third anode measured along a direction traversing the first sub-pixel, the second sub-pixel, and the third sub-pixel and where P denotes a width of the pixel measured along the direction traversing the first sub-pixel, the second sub-pixel, and the third sub-pixel.

The OLED display may further include a pixel defining layer disposed on edge portions of the first, second, and third anodes. The pixel defining layer may form a first opening exposing a portion of the first anode, a second opening exposing a portion of the second anode, and a third opening exposing a portion of the third anode.

The first anode, the second anode, the third anode, and the pixel defining layer may satisfy the following condition:

$$w1 + w2 + 12\ \mu m < W1 + W2$$

where w1 and w2 respectively denote a width of the first opening and a width of the second opening measured along the direction traversing the first, second, and third sub-pixels.

The widths of the first, second, and third anodes may be gradually decreased in the order of the third anode, the first anode, and the second anode. The widths of the first, second, and third openings may be gradually decreased in the order of the third opening, the first opening, and the second opening.

The widths of the first, second, and third openings may be respectively smaller than those of the first, second, and third anodes. The edge portions of the first, second, and third anodes that are overlapped with the pixel defining layer may have a constant width. The constant width of each of the edge portions of the first, second, and third anodes that are overlapped with the pixel defining layer may be greater than 3 μm.

The second anode may include an externally extended via hole region, and the second organic emission layer may be formed on the second anode, excluding the via hole region.

The OLED display may further include a black-colored planarization layer disposed in a lower portion of the first, second, and third anodes. In one embodiment, the first, second, and third anodes is between the black-colored planarization layer and the first, second, and third organic emission layers.

The first organic emission layer may be an organic emission layer for a red color. The second organic emission layer may be an organic emission layer for a green color. The third organic emission layer may be an organic emission layer for a blue color.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
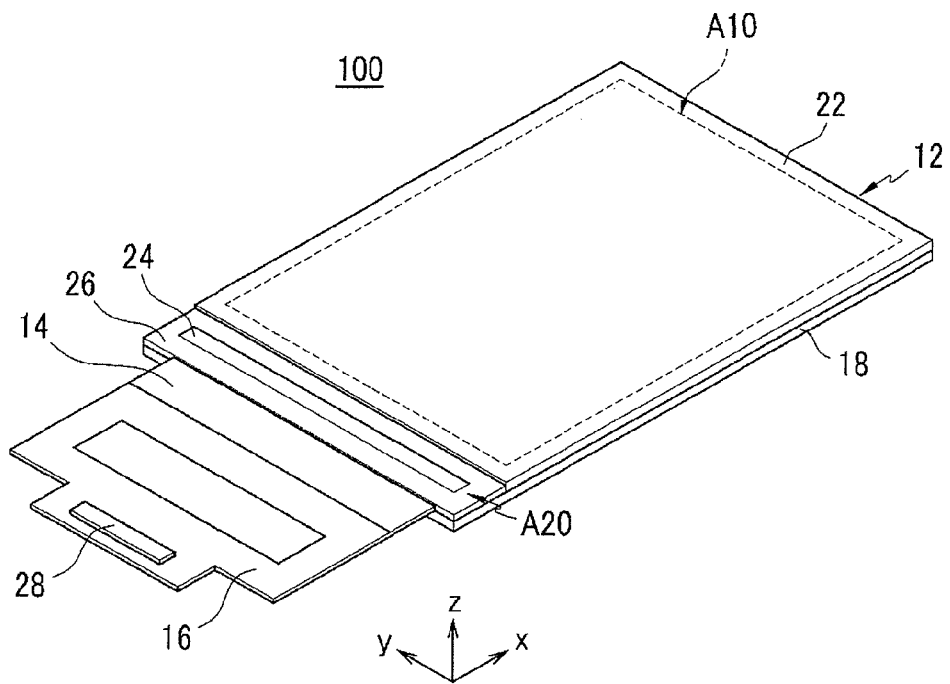
FIG. 1 is a perspective schematic view of an OLED display according to a first exemplary embodiment of the present invention.
Figure 2:
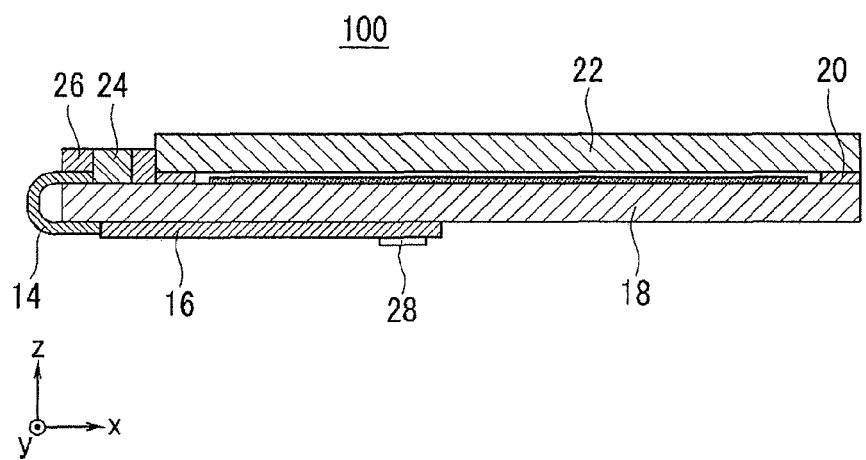
FIG. 2 is a cross-sectional schematic view of the OLED display according to the first exemplary embodiment of the present invention.

FIG. 1 and FIG. 2 respectively show a perspective schematic view and a cross-sectional schematic view of an organic light emitting diode (OLED) display according to a first exemplary embodiment of the present invention.

Referring to FIG. 1 and FIG. 2, an OLED display 100 according to the present exemplary embodiment includes a panel assembly 12, a flexible circuit board 14, and a printed circuit board 16. The panel assembly 12 includes a display area A10 and a pad area A20, and displays an image in the display area A10. The flexible circuit board 14 is fixed to the pad area A20, and the printed circuit board 16 is electrically connected with the panel assembly 12 through the flexible circuit board 14.

The panel assembly 12 includes a first substrate 18 and a second substrate 22. The second substrate 22 is smaller than the first substrate 18 and of which an edge portion is attached to the first substrate 18 by a sealant 20 (FIG. 2). The display area A10 is located in an area where the first and second substrates 18 and 22 are overlapped at a region defined by an interior side or sides of the sealant 20, and the pad area A20 is located on the first substrate 18 at an external side (i.e., a side facing away or oppositely away from the interior side) of the sealant 20.

A plurality of sub-pixels are disposed in a matrix pattern in a display region on the display area A10 of the first substrate 18, and a scan driver and a data driver are located between the display area A10 and the sealant 20 or at the external side of the sealant 20 for driving the sub-pixels. In the pad area A20 of the first substrate 18, pad electrodes for transmitting electrical signals to the scan and data drivers are located.

An integrated circuit chip 24 and the flexible circuit board 14 are mounted on the pad area A20 of the first substrate 18. A protective layer 26 is formed around the integrated circuit chip 24 and the flexible circuit board 14 to protect pad electrodes formed in the pad area A20 by covering them. Surface Mounted Devices are mounted on the printed circuit board 16 for passing driving signals, and a connector 28 is installed on the printed circuit board 16 for transmitting an external signal thereto.

In a rear side of the panel assembly 12, a bezel for increasing bending strength of the panel assembly 12 or a buffering tape for increasing impact resistance of the panel assembly 12 may be formed. The flexible circuit board 14 fixed to the pad area A20 is bent toward the rear side of the panel assembly 12 to make the printed circuit board 16 face the rear side of the panel assembly 12 as shown in FIG. 2.

Figure 3:
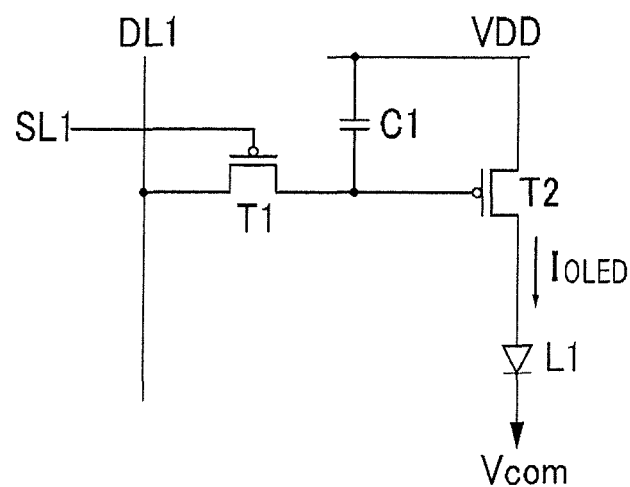
FIG. 3 is a circuit schematic diagram of a sub-pixel of a panel assembly of FIG. 1.
Figure 4:
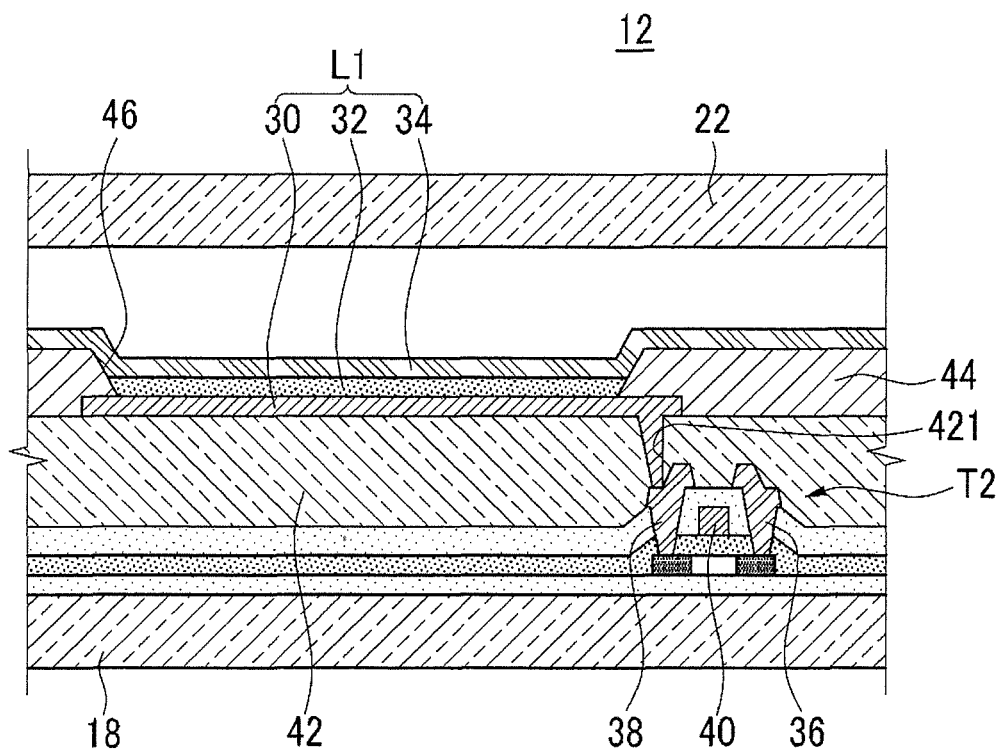
FIG. 4 and FIG. 5 show partially exploded cross-sectional schematic views of the panel assembly of FIG. 1.

FIG. 3 is a circuit schematic diagram of a sub-pixel of the panel assembly of FIG. 1, and FIG. 4 is a cross-sectional schematic view of the panel assembly of FIG. 1.

Referring to FIG. 3 and FIG. 4, a sub-pixel of the panel assembly 12 is formed of an OLED L1 and a driving circuit unit. The OLED L1 includes an anode (hole injection electrode) 30, an organic emission layer 32, and a cathode (electron injection electrode) 34. Here, the driving circuit unit includes at least two thin film transistors T1 and T2 and at least one storage capacitor C1. Here, in one embodiment, the at least two thin film transistors include a switching transistor T1, and a driving transistor T2.

The switching transistor T1 is connected to a scan line SL1 and a data line DL1, and transmits a data voltage from the data line DL1 according to a switching voltage from the scan line SL1 to the driving transistor T2. The storage capacitor C1 is connected to the switching transistor T1 and a power source line VDD, and stores a voltage that corresponds to a difference of a voltage transmitted from the switching transistor T1 and a voltage supplied to the power source line VDD.

The driving transistor T2 is connected to the power source line VDD and the storage capacitor C1 and supplies an output current $I_{OLED}$ that is proportional to a square of a difference between the voltage stored in the storage capacitor C1 and a threshold voltage to the OLED L1, and the OLED L1 emits light in accordance with the output current $I_{OLED}$. As shown in FIG. 4, the driving transistor T2 includes a source electrode 36, a drain electrode 38, and a gate electrode 40, and the anode 30 of the OLED L1 may be connected to the drain electrode 38 of the driving transistor T2.

A planarization layer 42 is disposed on the source electrode 36 and the drain electrode 38 of the driving transistor T2, and the anode 30 is formed on the planarization layer 42. A via hole 421 is formed in the planarization layer 42, and the anode 30 is connected to the drain electrode 38 through the via hole 421. A pixel defining layer 44 is formed on the anode 30 and the planarization layer 42. The pixel defining layer 44 forms an opening 46 in a portion that overlaps the anode 30 in each sub-pixel to expose the anode 30. In addition, the organic emission layer 32 is filled in the opening of the pixel defining layer 44 and thus contacts the anode 30.

The organic emission layer 32 may be formed to be the same size as or larger than the opening 46 of the pixel defining layer 44. That is, if the size (e.g., a surface area) of the organic emission layer 32 is larger than that of the opening 46 of the pixel defining layer 44, the organic emission layer 32 may be formed over a side wall of the fixed defining layer 44 at where the opening 46 is formed and an upper surface of the pixel defining layer 44. In FIG. 4, as an example, the size of the organic emission layer 32 is substantially the same as that of the opening 46 of the pixel defining layer 44. The configuration of the sub-pixel is not limited thereto, and may be suitably modified.

In the previously described OLED L1, the anode 30 is formed as a metal layer having a light reflection characteristic, and the cathode 34 is formed as a transparent conductive layer. Therefore, light emitted from the organic emission layer 32 is emitted out of the panel assembly 12 through the cathode 34 and the second substrate 22, and the anode 30 reflects light emitted toward the first substrate 18 among the light emitted from the organic emission layer 32 to increase luminous efficiency. In this case, the anode 30 reflects not only light emitted from the organic emission layer 32, but also light transmitted from the outside (e.g., sunlight) and into the panel assembly 12.

According to the following configuration of the anode 30, the OLED display 100 of an exemplary embodiment can provide luminous efficiency while reducing or minimizing reflection of external light due to the anode 30.

Figure 5:
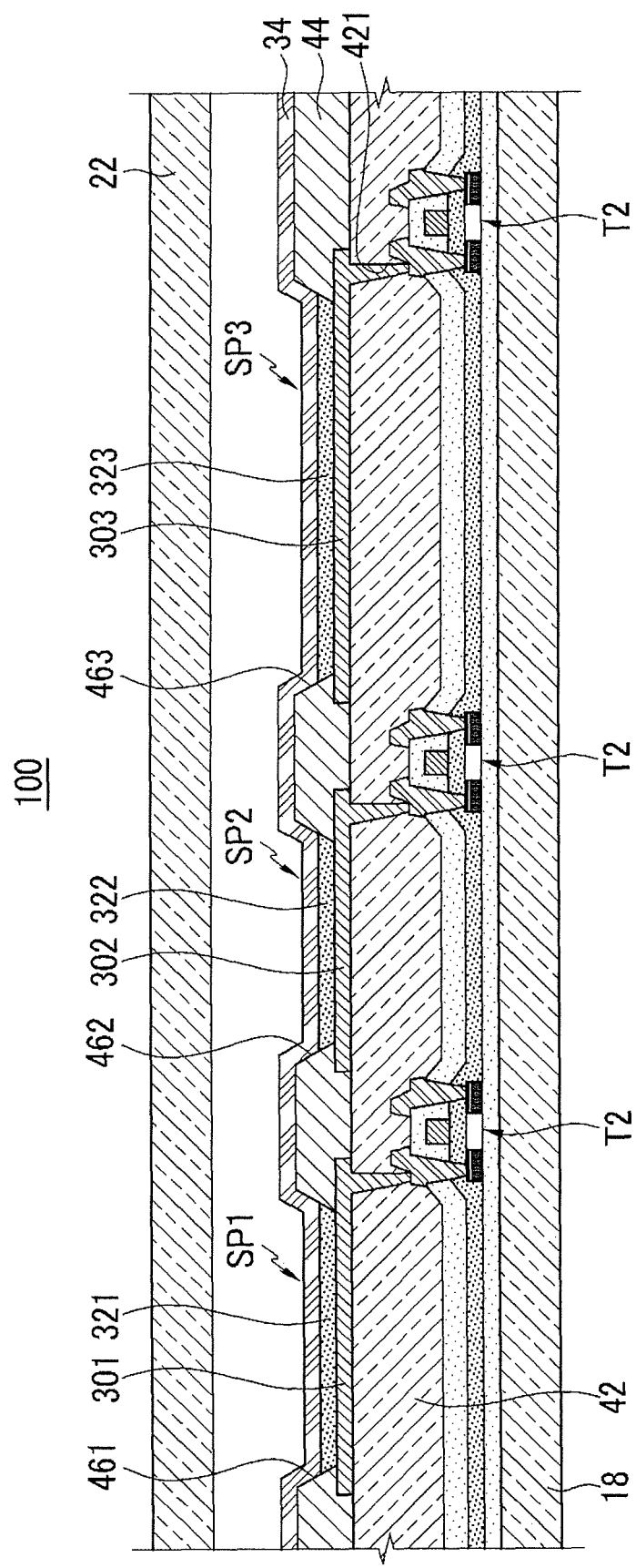
Figure 6:
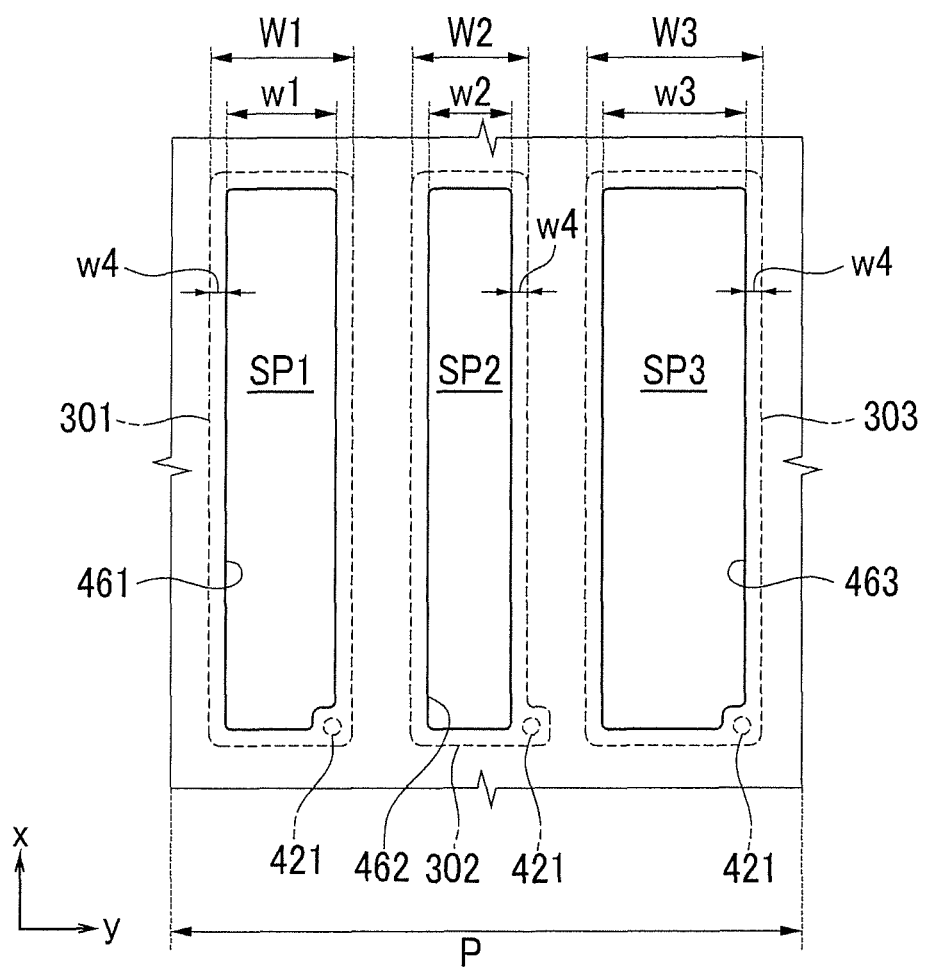
FIG. 6 is a top plan schematic view of an anode and a pixel defining layer in a configuration of the panel assembly of FIG. 5.
Figure 7:
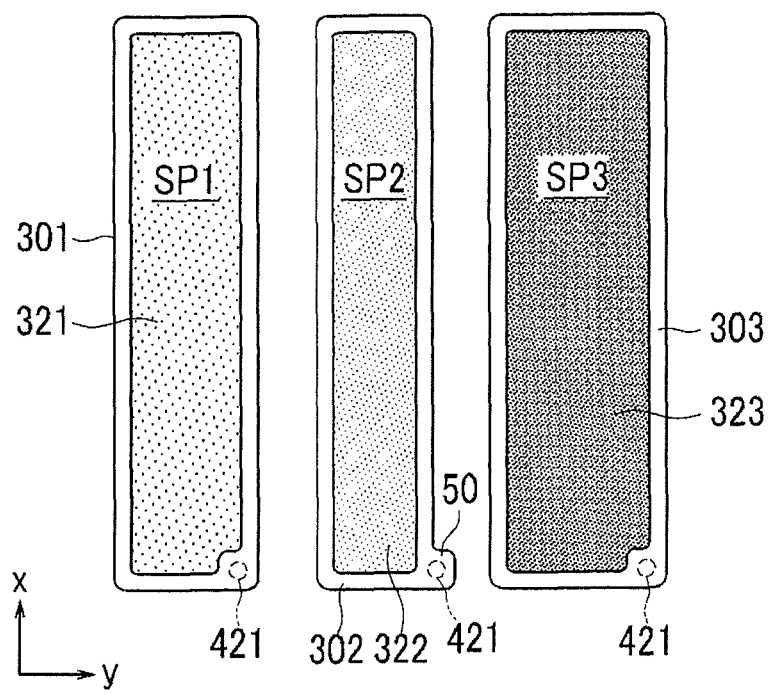
FIG. 7 is a top plan schematic view of the anode and an organic emission layer in the configuration of the panel assembly of FIG. 5.

FIG. 5 is a partially enlarged cross-sectional schematic view of the panel assembly of FIG. 1, FIG. 6 is a top plan schematic view of the anode and the pixel defining layer of FIG. 5, and FIG. 7 is a top plan schematic view of the anode and the organic emission layer of FIG. 5.

Referring to FIG. 5 to FIG. 7, a pixel of the OLED display 100 includes a first sub-pixel SP1 including a first anode 301 and a first organic emission layer 321, a second sub-pixel SP2 including a second anode 302 and a second organic emission layer 322, and a third sub-pixel SP3 including a third anode 303 and a third organic emission layer 323. The cathode 34 is formed over the first to third sub-pixels SP1, SP2, and SP3 rather than being divided for each sub-pixel.

In the first exemplary embodiment, the OLED display 100 has the first sub-pixel SP1 corresponding to a red color, the second sub-pixel SP2 corresponding to a green color, and the third sub-pixel SP3 corresponding to a blue color in order to realize a full-colored image. Accordingly, the first organic emission layer 321 is formed as an emission layer for the red color, the second organic emission layer 322 is formed as an emission layer for the green color, and the third organic emission layer 323 is formed as an emission layer for the blue color. However, each color realized by each of the plurality of organic emission layers is not limited thereto, and it may be appropriately modified according to the realization purpose or configuration of the OLED display and a choice of a person having ordinary skill in the art.

The pixel defining layer 44 includes a first opening 461 disposed in the first sub-pixel SP1, a second opening 462 disposed in the second sub-pixel SP2, and a third opening 463 disposed in the third sub-pixel SP3. The first to third anodes 301, 302, and 303 respectively have different widths, and the first to third openings 461, 462, and 463 also have different widths.

In FIG. 6, the widths of the first to third anodes 301, 302, and 303 disposed along a direction (the x-axis in the drawing) traversing the first to third sub-pixels SP1, SP2, and SP3 are respectively denoted as W1, W2, and W3. In addition, the widths of the first to third openings 461, 462, and 462 disposed along a direction that is the same as that of the first to third anodes 301, 302, and 303 (i.e., along the direction (the y-axis in the drawing) traversing the first to third sub-pixels SP1, SP2, and SP3) are respectively denoted as w1, w2, and w3.

The widths of the first to third anodes 301, 302, and 303 and the widths of the first to third openings 461, 462, and 463 may be inversely proportional to luminance efficiency of the first to third organic emission layers 321, 322, and 323 respectively disposed in the corresponding sub-pixels. That is, an organic emission layer having the lowest luminous efficiency among the first to third organic emission layers 321, 322, and 323 may have a larger area in the pixel by increasing the width of the anode and the width of the opening than the widths of the corresponding anode and opening of organic emission layers having relatively higher luminous efficiency.

The widths of the first to third anodes 301, 302, and 303 may be gradually decreased in the order of the third anode 303, the first anode 301, and the second anode 302, and the widths of the openings 461, 462, and 463 may also be gradually decreased in the order of the third opening 463, the first opening 461, and the second opening 462. To put it another way, the width W3 of the third anode 303 is larger than the width W1 of the first anode 301, and the width W1 of the first anode 301 is larger than the width W2 of the second anode 302. In addition, the width w3 of the third opening 463 is larger that the width w1 of the first opening 461, and the width w1 of the first opening 461 is larger than the width w2 of the second opening 462. Therefore, the size of the first, second, and third organic emission layers 321, 322, and 323 in one pixel may be gradually decreased in the order of the third organic emission layer 323, the first organic emission layer 321, and the second organic emission layer 322.

In addition, the first to third anodes 301, 302, and 303 are formed wider than the openings 461, 462, and 463 of the pixel defining layer 44 of the corresponding sub-pixel so that the edge portions of the first to third anodes 301, 302, and 303 partially overlap the pixel defining layer 44. In this case, excluding a portion where the via hole 421 is formed, the edges of the openings 461, 462, and 463 of the pixel defining layer 44 are separated by a set or predetermined distance from the edges of the anodes 301, 302, and 303. Therefore, excluding a portion where the via hole 421 is formed, the overlapped portions w4 (refer to FIG. 6) of the first to third anodes 301, 302, and 303 and the pixel defining layer 44 may have a constant width.

The first, second, and third organic emission layers 321, 322, and 323 may be formed to have the same or a greater width than the openings 461, 462, and 463 of a pixel defining layer 44 of the corresponding sub-pixel. In FIG. 7, the first to third organic emission layers 321, 322, and 323 are formed to be the same (or substantially the same) in size as the openings 461, 462, and 463 of the pixel defining layer of the corresponding sub-pixel.

In the OLED display 100 according to the present exemplary embodiment, the first to third anodes 301, 302, and 303 satisfy the following condition 1.

$$W1 + W2 < 2W3 < \frac{2}{3}P \qquad 1$$

Here, P denotes the width of a pixel.

In condition 1, if the sum of W1 and W2 is more than two times W3, the third anode 303 and the third organic emission layer 323 does not have sufficient areas in the pixel so that luminance efficiency of the third organic emission layer 323 cannot be increased. In addition, if twice W3 is more than two thirds the pixel width P in condition 1, the areas of the first and second anodes 301 and 302 and the areas of the first and second organic emission layers 321 and 322 are excessively decreased such that luminance efficiency of the first and second organic emission layers 321 and 322 may not be enough.

In addition, in the OLED display 100 according to the present exemplary embodiment, the first to third anodes 301, 302, and 303 and the pixel defining layer 44 satisfy the following condition 2.

$$w1+w2+12 \text{ }\mu m<W1+W2 \qquad 2$$

Condition 2 implies that the width w4 of the overlapped portion of the first to third anodes 301, 302, and 303 and the pixel defining layer 44 is greater than 3 μm.

If condition 2 is not satisfied, the pattern quality of the pixel defining layer 44 is deteriorated when the openings 461, 462, and 463 of the pixel defining layer 44 are formed through the photolithography process so that the pixel defining layer 44 at the edge portions of the anodes 301, 302, and 303 may be damaged. In this case, the anodes 301, 302, and 303 may contact the cathode 34 at the edge portions of the anode 301, 302, and 303 such that an electrical short circuit may occur, thereby causing damage to the organic emission layers 321, 322, and 323.

Since the OLED display 100 according to the present exemplary embodiment satisfies condition 2, the electrical short circuit between the anodes 301, 302, and 303 and the cathode 34 and the damage to the organic emission layers 321, 322, and 323 can be suppressed.

As described, in the OLED display 100 according to the present exemplary embodiment, the width of each of the anodes 301, 302, and 303 is set to be different from each other for each sub-pixel according to efficiency of the organic emission layers 321, 322, and 323 while reducing or minimizing the width w4 of the overlapped portion of the anodes 301, 302, and 303 with the pixel defining layer 44.

Therefore, when light is emitted from the organic emission layers 321, 322, and 323 of the corresponding sub-pixel, the first to third anodes 301, 302, and 303 can reduce or minimize unexpected reflection of external light by reducing or minimizing the width w4 of the portion overlapped with the pixel defining layer 44 while increasing efficiency of reflection toward the second substrate 22. Accordingly, the OLED display 100 according to the present exemplary embodiment can improve visibility by decreasing reflection of external light (by decreasing or minimizing width w4).

In the above-described sub-pixel configuration, the first to third organic emission layers 321, 322, and 323 may be formed in such a configuration that one or more of these layers 321, 322, and 323 do not overlap with their corresponding via holes 421 by being patterned so that the planarity of the organic emission layers 321, 322, and 323 and the cathode 34 can be increased.

For example, the first and third anodes 301 to 303 that have relatively large widths and areas among the first to third anodes 301, 302, and 303 may have a rectangular shape and the via hole 421 may be formed inside thereof. In addition, the first and third organic emission layers 321 and 323 may have a partially concave portion so as to maintain a constant distance with their corresponding via holes 421.

On the other hand, the second anode 302 having the smallest width and area among the first to third anodes 301, 302, and 303 may have an externally extended via hole region 50 (refer to FIG. 7). The via hole 421 here is disposed in the via hole region 50, and the second organic emission layer 322 may be formed in a rectangular shape on the second anode electrode 302, excluding the via hole region 50. Therefore, sufficient patterning space can be easily obtained in the second sub-pixel having the smallest width and area. To put it another way, in the embodiment as shown, each of the first and third anodes 301 and 303 has a polygonal shape region (e.g., a rectangular shape region) and a via hole region therein, and each of the first and third organic emission layers has the partially concave portion at the via hole region (or at a position corresponding to the via hole 421). By contrast, the second anode 302 has a polygonal shape region and the externally extended via hole region extending out of the polygonal shape region, and the second organic emission layer 322 is formed only on the polygonal shape region of the second anode 302.

Figure 8:
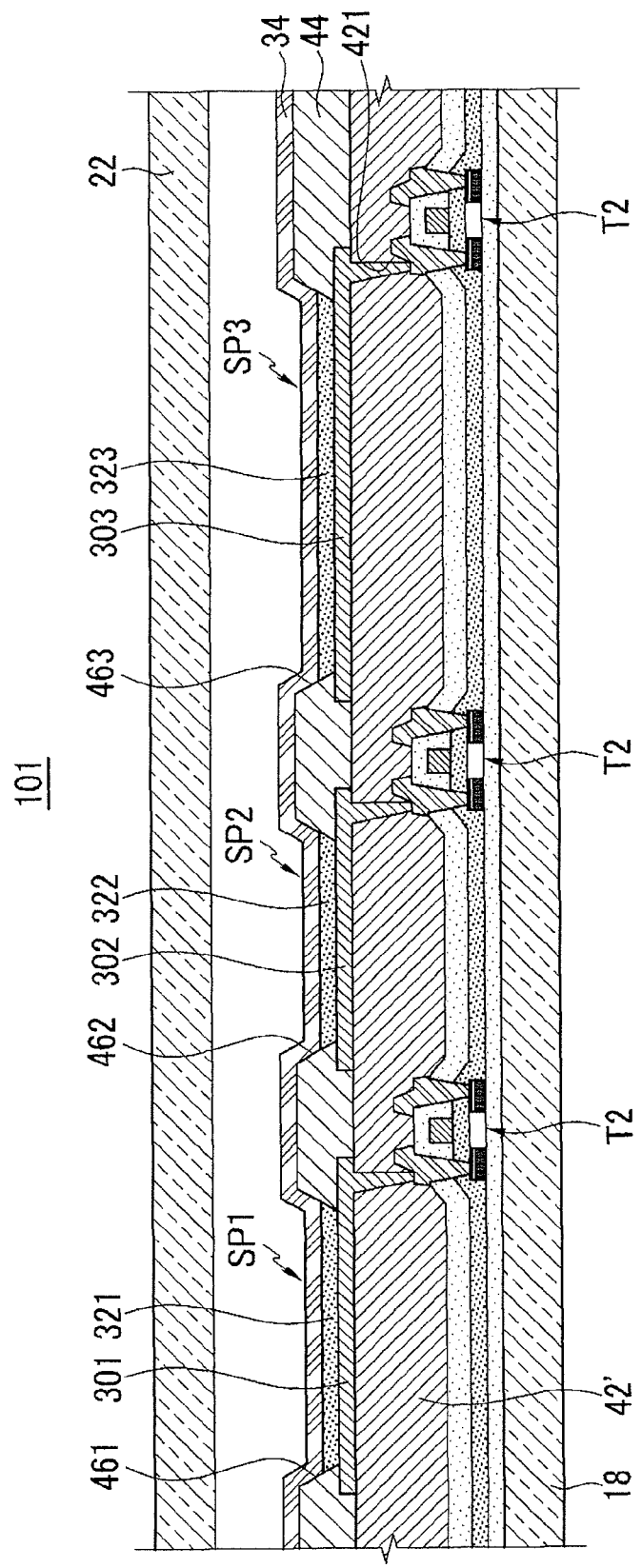
FIG. 8 is a partially exploded cross-sectional schematic view of a panel assembly in a configuration of a light emitting device according to a second exemplary embodiment of the present invention.

FIG. 8 is a partially enlarged cross-sectional view of a panel assembly in a configuration of a light emitting device according to a second exemplary embodiment of the present invention.

Referring to FIG. 8, an OLED display 101 according to the present exemplary embodiment is the same as the OLED display of the first exemplary embodiment, excluding that a planarization layer 42' is formed of a black-colored material that absorbs light. Like reference numerals are used for like elements of the first exemplary embodiment.

The planarization layer 42' may be formed as a black-colored acryl-based material. The black planarization layer 42' absorbs external light transmitted to portions between anodes 301, 302, and 303 to improve outdoor visibility. Therefore, the OLED display 101 of the second exemplary embodiment can further decrease reflection of external light compared to the OLED 100 of the first exemplary embodiment so that outdoor display visibility can be improved.

The following Table 1 shows reflectance of external light of an OLED display of a comparative example, the OLED display of the first exemplary embodiment, and the OLED display of the second exemplary embodiment, measured through computer simulation. The OLED display of the comparative example includes anodes each having the same width measured along the direction traversing the first to third sub-pixels, and is the same (or substantially the same) as the OLED display of the first exemplary embodiment, excluding the shape of the anodes.

TABLE 1

|  | Reflectance of external light |
|---|---|
| Comparative example | 40.8% |
| First exemplary embodiment | 37.2% |
| Second exemplary embodiment | 36.4% |

Simulation measurement of the reflectance of external light is performed through a comparative experiment of reflectance of external light of a standard reflection plate and reflectance of external light of the experiment subject under a condition of using the same standard light source. The reflectance of external light in the table is a calculated value of a comparative value to the reflectance of external light of the standard reflection plate under an assumption that the reflectance of external light of the standard reflection plate is 100.

As shown in the table, the reflectance of the external light can be decreased more in the OLED display of the first and second exemplary embodiments where the widths of the anodes is varied than in the OLED display of the comparative example where the widths of the anodes are the same in first to third sub-pixels, and particularly, the reflectance of the external light is decreased by a maximum of 4.4% in the OLED display of the second exemplary embodiment where the black planarization layer is formed.

As such and in view of the foregoing, the OLED display according to an embodiment of the present invention can improve outdoor visibility by reducing or minimizing reflection of external light due to anodes. In addition, the planarization layer according to an embodiment of the present invention is formed as a black-colored material so that external light transmitted to portions between the anodes can be absorbed by the black planarization layer, thereby further improving the outdoor visibility.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising a pixel having a plurality of sub-pixels and a pixel defining layer, wherein the plurality of sub-pixels comprises:
a first sub-pixel comprising a first anode and a first organic emission layer;
a second sub-pixel comprising a second anode and a second organic emission layer; and
a third sub-pixel comprising a third anode and a third organic emission layer,
wherein the first anode, the second anode, and the third anode satisfy the following condition:

$$W1 + W2 < 2W3 < \frac{2}{3}P$$

wherein W1, W2, and W3 respectively denote a width of the first anode, a width of the second anode, and a width of the third anode measured along a direction traversing the first sub-pixel, the second sub-pixel, and the third sub-pixel, and wherein P denotes a width of the pixel measured along the direction traversing the first sub-pixel, the second sub-pixel, and the third sub-pixel; and wherein the pixel defining layer is on edge portions of the first, second, and third anodes and has a first opening exposing a portion of the first anode, a second opening exposing a portion of the second anode, and a third opening exposing a portion of the third anode, and wherein the first anode, the second anode, the third anode, and the pixel defining layer satisfy the following condition:

$$w1+w2+12\ \mu m < W1+W2$$

wherein w1 and w2 respectively denote a width of the first opening and a width of the second opening measured along the direction traversing the first, second, and third sub-pixels; and wherein the first, second, and third anodes are reflective electrodes.

2. The OLED display of claim 1, wherein the widths of the first, second, and third anodes are gradually decreased in the order of the third anode, the first anode, and the second anode.

3. The OLED display of claim 2, wherein the widths of the first, second, and third openings are gradually decreased in the order of the third opening, the first opening, and the second opening.

4. The OLED display of claim 3, wherein the widths of the first, second, and third openings are respectively smaller than those of the first, second, and third anodes, and the edge portions of the first, second, and third anodes that are overlapped with the pixel defining layer have a constant width.

5. The OLED display of claim 4, wherein the constant width of each of the edge portions of the first, second, and third anodes that are overlapped with the pixel defining layer is greater than 3 μm.

6. The OLED display of claim 4, wherein the second anode comprises an externally extended via hole region, and the second organic emission layer is on the second anode, excluding the via hole region.

7. The OLED display of claim 4, wherein each of the first and third anodes has a polygonal shape region and a via hole region therein, and each of the first and third organic emission layers has a partially concave portion at the via hole region.

8. The OLED display of claim 7, wherein the second anode has a polygonal shape region and an externally extended via hole region extending out of the polygonal shape region, and the second organic emission layer is only on the polygonal shape region of the second anode.

9. The OLED display of claim 1, wherein the width of the third anode is larger than the width of the first anode, and the width of the first anode is larger than the width of the second anode.

10. The OLED display of claim 9, wherein the width of the third opening is larger than the width of the first opening, and the width of the first opening is larger than the width of the second opening.

11. The OLED display of claim 1, further comprising a black-colored planarization layer, wherein the first, second, and third anodes are between the black-colored planarization layer and the first, second, and third organic emission layers.

12. The OLED display of claim 1, wherein the first organic emission layer is an organic emission layer for a red color.

13. The OLED display of claim 1, wherein the second organic emission layer is an organic emission layer for a green color.

14. The OLED display of claim 1, wherein the third organic emission layer is an organic emission layer for a blue color.

15. The OLED display of claim 1, wherein the first organic emission layer is an organic emission layer for a red color, the second organic emission layer is an organic emission layer for a green color, and the third organic emission layer is an organic emission layer for a blue color.

* * * * *